United States Patent [19]

Akrout et al.

[11] Patent Number: 4,914,634
[45] Date of Patent: Apr. 3, 1990

[54] REFERENCE VOLTAGE GENERATOR FOR CMOS MEMORIES

[75] Inventors: Chekib Akrout, Orangis; Pierre Coppens, Savigny le Temple; Bernard Denis, Mennecy; Pierre-Yves Urena, Vence, all of France

[73] Assignee: International Business Machines Corporation, Armonk, N.Y.

[21] Appl. No.: 284,038

[22] Filed: Dec. 14, 1988

[30] Foreign Application Priority Data

Dec. 15, 1987 [EP] European Pat. Off. ........ 87480024.6

[51] Int. Cl.⁴ ............................................. G11C 13/00
[52] U.S. Cl. ................................ 365/233; 365/189.09; 365/230.06
[58] Field of Search ...................... 365/189.09, 230.06, 365/233

[56] References Cited

FOREIGN PATENT DOCUMENTS 0040917 12/1981 European Pat. Off. .
3520025 6/1985 Fed. Rep. of Germany .
2092408 1/1982 United Kingdom .

OTHER PUBLICATIONS

"A 4.5 ns 256 k CMOS SRAM with Tri-Level Word Line", Shinohara et al., 1985, IEEE International Solid-State Circuits Conference, pp. 62-63.

Primary Examiner—Terrell W. Fears
Attorney, Agent, or Firm—Jeffrey L. Brandt

[57] ABSTRACT

A semiconductor memory device including a pair of bit lines (BL, $\overline{BL}$) having relatively high stray capacitances (C1, C2), a word line (WL), and a memory cell (MC1) connected to the bit lines and word line for selection by an address signal, and a restore circuit comprising a coupling/equalizing circuit (12) controlled by a BLR clock and a reference voltage generator (51) for quickly restoring the bit lines. The reference voltage generator (51) comprises both static and dynamic current sources. The static current source consists of a small N MOS transistor (N52) operating as a resistor load, while the dynamic current source consists of at least one small P MOS transistor (P'53, ...), connected in parallel with the N MOS transistor, and gated with a clock (BCC', ...) derived from the BLR clock, so that the P MOS transistor is turned ON during the restore time. An additional N device (N54) may be inserted between the reference line (RL) and ground (GND). The improved reference voltage of the present invention significantly reduces both consumed silicon area and restore time.

8 Claims, 3 Drawing Sheets

REFERENCE VOLTAGE GENERATOR FOR CMOS MEMORIES

DESCRIPTION

The present invention relates to CMOS logic and memory circuits, and is more particularly related to an improved reference voltage generator for such circuits. The generator of the present invention is particularly suitable for the restore circuit of memories of either the static type: Static Random Access memories (SRAMs) or dynamic type: Dynamic Random Access Memories (DRAMs).

BACKGROUND OF THE INVENTION

In SRAMs data is typically stored in cross coupled transistor stages where one or more paths to ground can be selectively switched on or off, while in DRAMs, data is stored in capacitors by the operation of one or more transistors.

An access operation is performed in the same manner for both types of memory, by discharging a path to ground.

A SRAM array comprises a matrix of static memory cells (MC), interconnected with horizontal word lines (WL) and vertical bit lines (BL). The memory cell is connected to the bit lines through transfer gate transistors, the gate of which is connected to the word line. Bit lines are common to all cells located on one column, and constitute column busses with a relatively high capacitance, due to the transmission gate transistors connected in parallel. Read/write operations are performed through these bit lines. Bit lines are pre-charged high to a specific voltage level known as the reference voltage, given by a reference voltage generator thru a coupling circuit. In accessing the static type cells, the cells selected through the word line decoder transfer stored data to bit lines by partially discharging the capacitance of one of the bit lines, thus developing a differential voltage between the two bit lines connected to a selected cell. This voltage difference is sensed by a sense amplifier (SA) and amplified/latched in an appropriate buffer, for subsequent outputting to input/output (I/0) pads of the SRAM where desired.

Thus the next access to the array can only occur after the previously selected bit lines have been restored to the reference voltage. This operation is called "bit line restore". The time required for this operation, or "the restore time", directly influences the cycle time, which is the sum of the access time and the restore time. This restore operation has therefore two disadvantages: first, it increases the memory cycle time, because the restore and access cannot overlap in time, and second it is necessary to charge the bit lines which have a relatively high capacitance.

In systems using dynamic memory cells which require destructive read cycles, data is read from the memory cell by detecting a voltage kick on the column bus as the capacitor of the memory cell is either charged or discharged when addressed.

Therefore there is a general problem in restoring highly capacitive busses or lines in memory circuits. The same reasoning also applies to logic circuits.

As far as SRAMs are concerned, a typical solution is given in the proceedings of the 1985 IEEE/SSCC Digest of Technical papers pp. 62–63 in an article entitled: "A 4.5 ns 256 K CMOS SRAM with Tri-level Word Line" by H. Shinohara et al, and in particular in FIG. 2 which shows a circuit schematic of a RAM including a standard restore circuit. FIG. 1 of the present application is typical of such prior art schemes.

FIG. 1 is a schematic diagram of a circuit 10, which is a portion of a conventional SRAM. Circuit 10 includes a conventional static memory cell MC1 which is part of an array of many such cells arranged in rows and columns in a standard manner. Memory cell MC1 is connected between two bit lines: BL (true) and $\overline{BL}$ (inverted or complementary bit line), which appear as column busses. Memory cell MC1 is addressed (i.e. enabled) by a row line or word line WL. The latter therefore addresses all the memory cells in one row. Transfer gate transistors mentioned above have not been represented for sake of simplicity. Column busses or bit lines BL and $\overline{BL}$ are respectively connected to the two arms of a sense amplifier (not represented) as known in the art. Bit lines BL and $\overline{BL}$ exhibit inherently high stray capacitances referenced C1 and C2 resulting from paralleling a great number of said transfer gate transistors and which increase with the number of cells in a column.

Circuit 10 also includes a restore circuit 11 for pulling up the potential of bit lines BL and $\overline{BL}$ to the reference voltage. Restore circuit 11 comprises two elementary circuits: a coupling/equalizing circuit 12 and a reference voltage generator 13. Circuit 12 comprises three P-channel transistors P14, P15 and P16, connected between BL and $\overline{BL}$, and gated by bit line restore clock BLR. Transistors P14 and P15 are used as coupling transistors. When turned on, they apply the reference voltage available on the reference line RL to the bit lines. On the other hand, the two bit lines BL and $\overline{BL}$ are also coupled together through transistor P16, so that the charge is equally shared between them. Thus, capacitances C1 and C2 are both charged to the level of the reference voltage. Transistor P16 therefore equalizes the charge of capacitances C1 and C2 and therefore the potential of the bit lines. Thus, transistors P14, P15 and P16 pre-charge the bit lines to the reference voltage, available on reference line RL, during the restore time. In all existing techniques known to the applicant, the reference voltage generator 13 simply consists of a common N channel transistor N17, the gate of which is connected to the drain which, in turn, is connected to a first power supply VH. Transistor N17 operates as a standard static current source, supplying the required current to high value capacitances C1 and C2, connected between the bit lines and a second power supply, in the present case, the ground GND. Transistor N17 is very large in size to avoid a considerable voltage drop on the reference line during the restore time. The reference potential is equal to VH−VT, VT being the threshold voltage of transistor N17.

A conventional solution to the problem of restoring highly capacitive bit lines to a defined reference voltage in a SRAM involves the use of a very stable reference voltage generator. This generator has to be very large to accommodate the required current supply in the bit line capacitances. Transistor N17 must then be designed large enough to generate the adequate pre-charge level on the memory bit lines. It is known to use a transistor with several millimeters of channel width, e.g. 15 mm, and therefore this solution requires considerable space in the design of modern silicon IC's.

If a smaller device were used, the designer would have to reduce the speed of restoration, which would result in a very long restore time. Generally, a compromise is made between speed and space, which results in unsatisfactory specifications.

The operation of the memory circuit shown in FIG. 1, with transistor N17 making such a speed/size compromise will be best understood with reference to the signal waveforms shown in FIG. 2, which illustrates the potential at various points of circuit 10. Before memory cell MC1 is accessed, in the initial state, reference line RL (curve 21, FIG. 2A), bit line $\overline{BL}$ (curve 23, FIG. 2C) and complement bit line BL (curve 24 for read operation, curve 25 for write operation, FIG. 2D) are all pre-charged to a level of one threshold voltage below the power supply, i.e. VH−VT. The bit line restore clock BLR (curve 22, FIG. 2B), varies between VH and GND (referenced 0). Following an access operation started between times t1 and t2, the potential of reference line RL begins to drop at time t2, due to the current supply to the bit lines. At the same time t2, the bit line restore signal BLR goes down to drive transistors P14 and P15, to provide the current from transistor N17 required to push up the potential of the bit lines (BL and $\overline{BL}$) to the reference voltage VH−VT. The restore operation lasts from time t2 to time t3. At time t3, the restore operation is considered finished, all lines, and in particular the reference line, are restored. Just after time t3, the BLR clock signal rises.

In this solution, in which a trade off has been made, say the size of transistor N17 is not large enough to be stable, which means that a significant voltage drop in curve 21 is tolerated, the standard restore time is about 12 ns.

This classic voltage source thus results in a speed disadvantage so as to avoid making transistor N17 excessively large. Because the current flow to charge the bit line capacitances is always limited by design constraints, reference voltage generators of the prior art are never optimal.

SUMMARY OF THE INVENTION

It is therefore a primary object of the present invention to provide an improved reference voltage generator, with reduced silicon area consumption and fast restoration of line capacitances to a reference voltage.

In accordance with one aspect of the present invention, there is provided an improved restore circuit for restoring a highly capacitive bus to a reference voltage level less than the nominal value of a power supply. The restore circuit includes coupling means connected between said bus and a reference line where said reference voltage is available, said reference voltage being supplied by a reference voltage generator. In the latter, according to the present invention, a dynamic current source is provided that is operated during the restore time.

In accordance with one aspect of the present invention, there is provided a new and improved restore circuit for restoring a highly capacitive bus to a reference voltage less than a voltage supplied by a power supply, the restore circuit of the type including coupling means connected between the bus and a reference line where the reference voltage is available, the improvement comprising: a static current source including a first MOS transistor of a first conductivity type operating as a resistor load connected between the power supply and the reference line; and a dynamic current source including a second MOS transistor of a second conductivity type connected in parallel with the first MOS transistor and so that it is turned ON during the restore time.

In accordance with another aspect of the present invention, there is provided, in a semiconductor memory device including a pair of bit lines connected to a reference line, each bit line having a relatively high stray capacitance, a word line, a memory cell connected to the bit lines and word line for selection by an address signal, and a restore circuit comprising a coupling/equalizing circuit controlled by a bit line restore clock, and a reference voltage generator, the improvement comprising: the generator including the combination of, (1) a static current source including a first MOS transistor of a first conductivity type operating as a resistor load connected between a first power supply and the reference line, and (2) a dynamic current source including a second MOS transistor of a second conductivity type connected in parallel with the first MOS transistor and gated with a signal derived from the bit line restore clock so that it is turned ON during the restore time.

BRIEF DESCRIPTION OF THE DRAWINGS

The novel features of this invention are set forth in the appended claims. The invention itself, however, as well as other objects and advantages thereof, may best be understood by reference to the following detailed description of illustrated embodiments, read in conjunction with the accompanying drawings.

DETAILED DESCRIPTION OF THE INVENTION

Figure 3A:
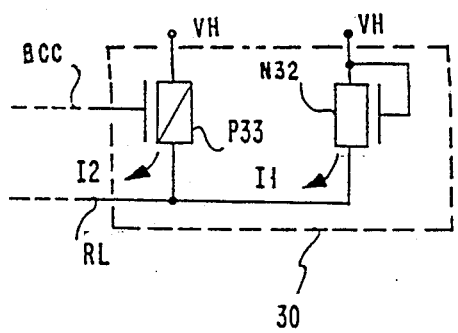
FIGS. 3A and 3B are schematic circuit diagrams of the improved reference voltage generator according to two embodiments of the present invention.
Figure 3B:
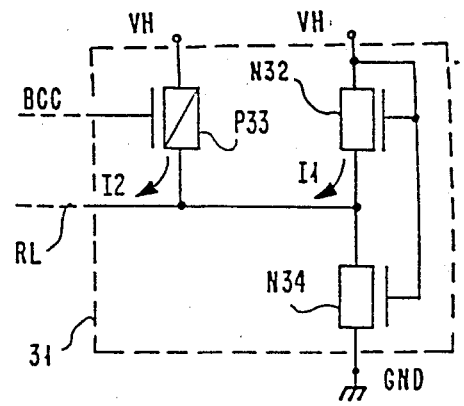

Two versions of an improved voltage reference generator in accordance with the present invention are shown in FIGS. 3A and 3B, and are respectively referenced by numerals 30 and 31. Comparing the circuits of FIGS. 3A, 3B with voltage reference generator 13 in FIG. 1, the present invention is seen to include the addition of a very fast dynamic voltage source in addition to the standard static current source device, thereby significantly reducing the size of the latter, while providing improved restore operation.

This very fast dynamic voltage source may be simply implemented by an additional P channel transistor P33, the size of which is $\frac{1}{3}$ to 1/5 the size of N32. Transistor P33 is only activated during the restore time by a boost control clock signal BCC, timed by the bit line restore BLR clock. As the drain of this device is at a maximum of (VH−VT), it operates in linear mode and quickly supplies additional current I2 to the reference line RL. In addition, transistor N32 is considerably smaller than transistor N17 of FIG. 1, by a factor of about 10.

In the embodiment of FIG. 3B, voltage reference generator 30 includes an additional transistor N34 connected between the reference line RL and a second supply voltage GND as shown in FIG. 3B. Transistor N34 is also a very small device bleeding current to activate the reference voltage generator 31. Transistor N34 functions to absorb any leak current generated by the circuit, and to avoid any coupling of the reference line RL (the potential of which might exceed VH−VT during the restore operation) with the reference voltage generator.

Figure 1:
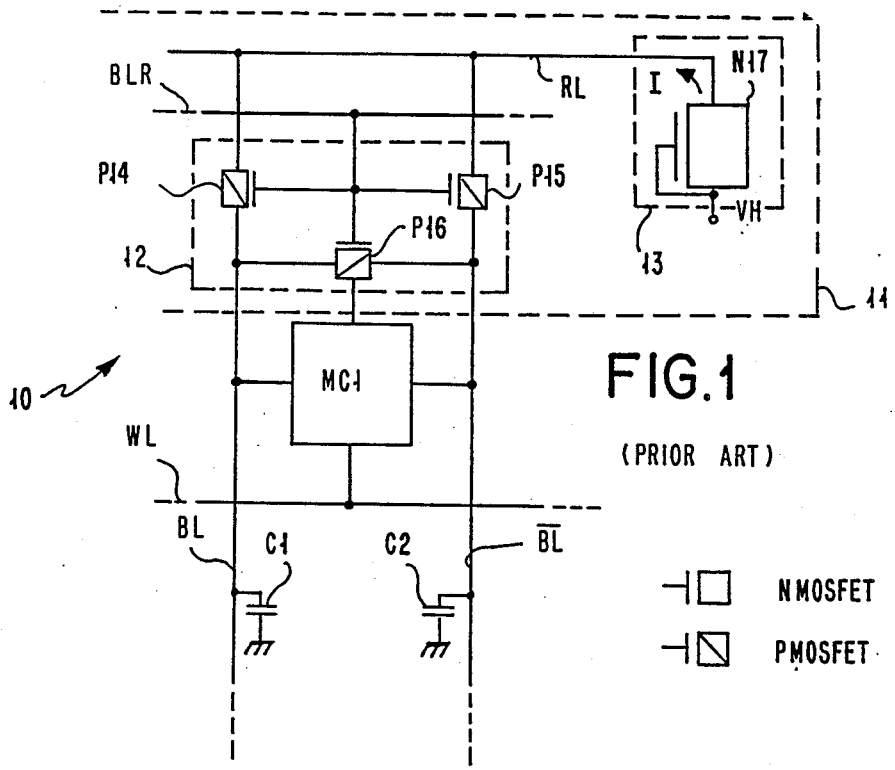
FIG. 1 is a schematic circuit diagram of a portion of a SRAM having a conventional restore circuit including a standard reference voltage generator.
Figure 2:
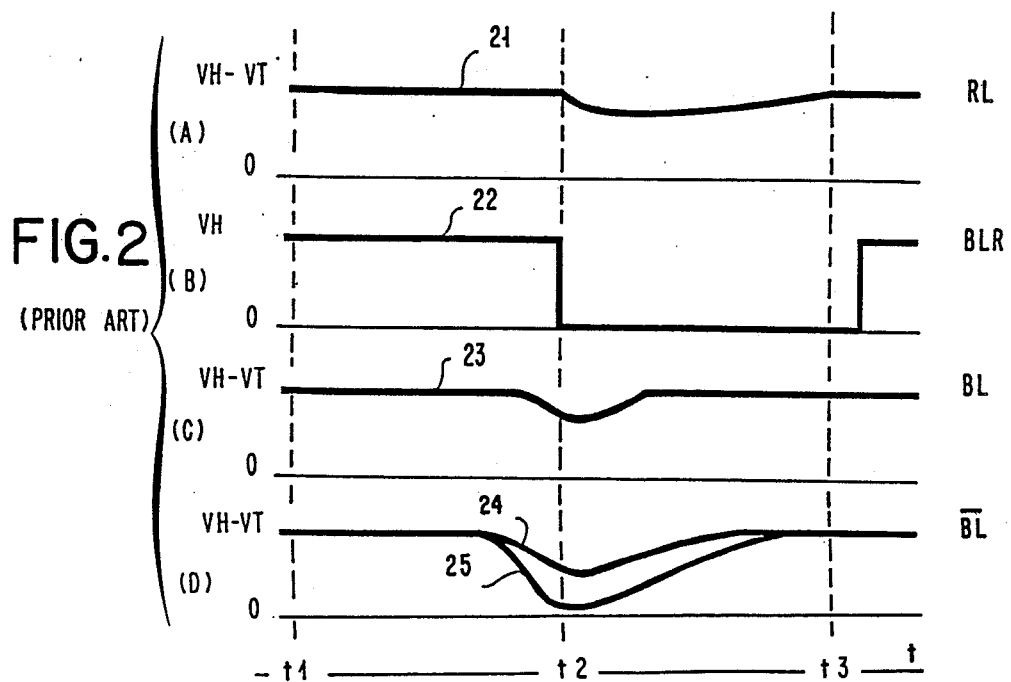
FIG. 2 is a timing chart at different points of the circuit shown in FIG. 1.
Figure 4:
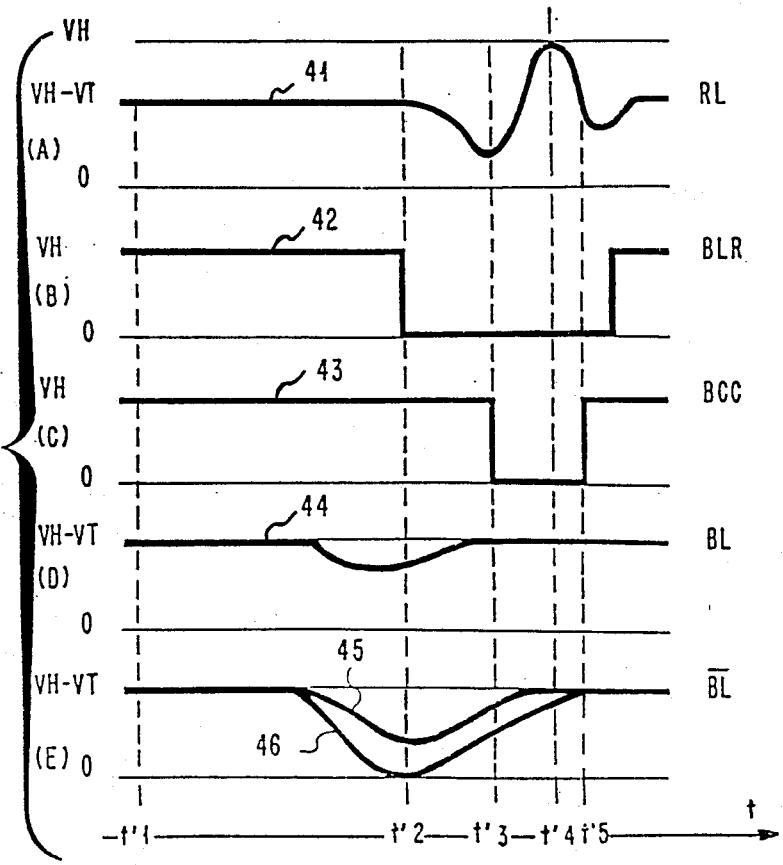
FIG. 4 is a timing chart at different points of the circuit shown in FIG. 3, enabling the results obtained to be compared with the conventional circuit shown in FIG. 1.

Turning now to FIG. 4, the timing diagram shows the potential at various points of the SRAM circuit of FIG. 1 when using the reference voltage generator shown in FIG. 3B. Before memory cell MC1 is accessed, in the initial state, reference line RL (curve 41, FIG. 4A), the bit line BL (curve 44, FIG. 4D) and the complement bit line $\overline{BL}$ (curve 45 for read operation, FIG. 4D, curve 46 for write operation, FIG. 4E) are pre-charged to the potential level of the reference line (FIG. 4A) which is lower than power supply voltage VH by the threshold voltage of transistor N32, and therefore at VH−VT. The bit line restore clock (curve 42, FIG. 4B), and the BCC clock (curve 43, FIG. 4C) vary between VH and GND.

Because transistor N32 is very small, at time t'2, which is the beginning of the restore operation, curve 41 shows a very sharp drop in the potential of the reference line, caused by the discharge of the accumulated charges in the bit line capacitances. At time t'3, transistor P33 operated by the BCC signal (curve 43), provides a current I2 which, in turn, compensates the drop in current I1 supplied by transistor N32. Due to this dynamic-boost, the potential of reference line RL (see curve 41) quickly reaches VH at time t'4, and sets at the reference voltage VH=VT shortly after time t'5. Time t'5 indicates the end of the restore operation. With the improved reference voltage generator of the present invention, restore times down to 2-3 nsec have been obtained, which are considerably less than when using previously known techniques of the type described.

The improved version of a restore circuit according to the present invention, when applied to SRAMs, provides significant performance improvements: the restore time is reduced by a factor of about three, and space required consumed is reduced by a factor of about ten.

The present reference voltage generator has been successfully demonstrated with hardware. A prototype ran at 91MHz, for a 50 MHz design specification.

Further, the reference voltage generator of the present invention is extremely versatile: various restore speeds and various capacitive loads could easily be accommodated.

Figure 5:
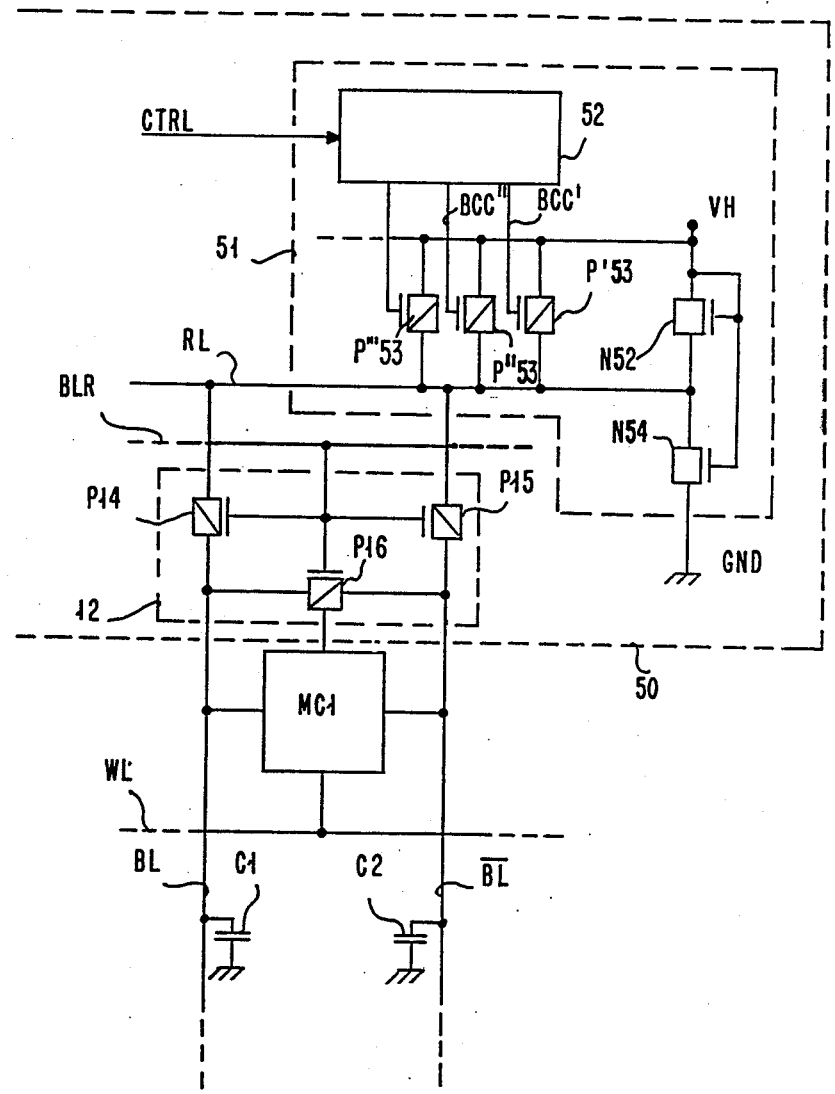
FIG. 5 is a schematic circuit diagram of a portion of a SRAM having an improved reference voltage generator according to another embodiment of the invention.

As an example of this versatility, depending on the desired restore speed, which may differ according to Read or Write operations, or the capacitive load to be driven (which in turn depends on the size of the memory), transistor P33 may be adapted to be variable in size. Circuit 51 of FIG. 5 illustrates such an embodiment. The circuit shown in FIG. 5 is the same portion of a conventional SRAM as that shown in FIG. 1, with a restore circuit 50 including a standard coupling/equalizing circuit 12, and a reference voltage generator 51 according to yet another embodiment of the present invention. Transistor P33, used in generators 30 and 31 (FIG. 3) is replaced by a plurality of n P transistors: P'53, ..., which are all connected in parallel, and the gates of which are connected to the separate outputs of a programmable adder 52. Depending on the control signal CTRL, applied to 52, the desired number of P transistors will be made active in parallel during the restore operation. A static current source comprises transistors N52 and N54.

Although the different embodiments of the invention described above relate to a P MOS transistor as a dynamic current source and a N MOS transistor as a static current source in a C MOS memory device, the invention is also applicable to MOS transistors with opposing conductivity.

In addition, the above concept, described with reference to an application involving SRAMs, may be generalized to any circuit design which requires restoration to a level less than a supply voltage VH.

What is claimed is:

1. In a semiconductor memory device including a pair of bit lines connected to a reference line, each bit line having a relatively high stray capacitance, a word line, a memory cell connected to said bit lines and word line for selection by an address signal, and a restore circuit comprising a coupling/equalizing circuit controlled by a bit line restore clock, and a reference voltage generator, the improvement comprising:

said generator including the combination of, a static current source including a first MOS transistor of a first conductivity type operating as a resistor load connected between a first power supply and said reference line, and a dynamic current source including a second MOS transistor of a second conductivity type connected in parallel with said first MOS transistor and gated with a signal derived from said bit line restore clock so that it is turned ON during the restore time.

2. A semiconductor memory device according to claim 1 wherein the said static current source further includes a third MOS transistor of said first type of conductivity connected between said reference line and a second power supply so as to bleed current to activate the generator and to avoid any coupling between said reference line and said generator.

3. A semiconductor memory device according to claim 1 wherein the said second MOS transistor consists of a plurality of n MOS transistors connected in parallel, the gates of which are connected to the outputs of a programmable adder controllable to select the number of active MOS transistors required to match the desired restore speed and/or the capacitive load to be driven.

4. A semiconductor memory device according to claim 1 wherein said first MOS transistor is of the N type.

5. In an improved restore circuit for restoring a highly capacitive bus to a reference voltage less than a voltage supplied by a power supply, said restore circuit of the type including coupling means connected between the bus and a reference line where the reference voltage is available, the improvement comprising:

a static current source including a first MOS transistor of a first conductivity type operating as a resistor load connected between said power supply and said reference line; and a dynamic current source including a second MOS transistor of a second conductivity type connected in parallel with said first MOS transistor and so that it is turned ON during the restore time.

6. An improved restore circuit according to claim 1, wherein said static current source also includes a third MOS transistor of said first type of conductivity connected between said reference line and a second power supply to bleed current to activate the generator and to avoid any coupling between said reference line and said generator.

7. An improved restore circuit according to claim 6, wherein said second MOS transistor consists of a plurality of n MOS transistors connected in parallel, the gates of which are connected to the outputs of a programmable adder controllable to select the desired number of active MOS transistors required to match the desired restore speed and/or the capacitive load to be driven.

8. An improved restore circuit according to claim 7, wherein the said first MOS transistor is of the N Type.

* * * * *